United States Patent
Jaeger et al.

(10) Patent No.: US 11,952,654 B2
(45) Date of Patent: Apr. 9, 2024

(54) LIQUID SPUTTER TARGET

(71) Applicant: EVATEC AG, Trübbach (CH)

(72) Inventors: Dominik Jaeger, Chur (CH); Thomas Tschirky, Mels (CH); Marco Rechsteiner, Werdenberg (CH); Heinz Felzer, Landquart (CH); Hartmut Rohrmann, Schriesheim (DE)

(73) Assignee: EVATEC AG, Trübbach (CH)

( * ) Notice: Subject to any disclaimer, the term of this patent is extended or adjusted under 35 U.S.C. 154(b) by 142 days.

(21) Appl. No.: 17/287,702

(22) PCT Filed: Oct. 22, 2019

(86) PCT No.: PCT/EP2019/078675
§ 371 (c)(1),
(2) Date: Apr. 22, 2021

(87) PCT Pub. No.: WO2020/083882
PCT Pub. Date: Apr. 30, 2020

(65) Prior Publication Data
US 2021/0381099 A1    Dec. 9, 2021

(30) Foreign Application Priority Data
Oct. 24, 2018  (CH) ..................... 01298/18

(51) Int. Cl.
*C23C 14/34*   (2006.01)
*C23C 14/35*   (2006.01)
(Continued)

(52) U.S. Cl.
CPC .......... *C23C 14/3428* (2013.01); *C23C 14/35* (2013.01); *C23C 14/54* (2013.01);
(Continued)

(58) Field of Classification Search
CPC ..... C23C 14/3428; C23C 14/35; C23C 14/54; H01J 37/3405; H01J 37/3426;
(Continued)

(56) References Cited

U.S. PATENT DOCUMENTS 5,211,824 A * 5/1993 Knapp ................ H01J 37/3405
                                                    204/192.15
5,507,931 A * 4/1996 Yang ................... H01J 37/3414
                                                    204/192.15
(Continued)

FOREIGN PATENT DOCUMENTS

EP    0685571 A1 * 6/1995    ............. C23C 14/34
EP    0908924 A1    4/1999
(Continued)

OTHER PUBLICATIONS

Translation to Vanden Brande (EP 0685571) published Jun. 1995.*
(Continued)

*Primary Examiner* — Nicholas A Smith
*Assistant Examiner* — Patrick S Ott
(74) *Attorney, Agent, or Firm* — Pearne & Gordon LLP

(57) ABSTRACT

A sputtering device to sputter a liquid target. The sputtering device including a trough to receive a liquid target material and a device to stir or agitate the liquid target material. The device configured to degas the liquid target material or/and to dissipate solid particles or islands on a surface of the target or/and to move such particles or islands from an active surface region to a passive surface region and/or vice-versa, whereby the passive surface region is at least 50% less exposed to sputtering as the active surface region.

29 Claims, 6 Drawing Sheets

(51) Int. Cl.
*C23C 14/54* (2006.01)
*H01J 37/34* (2006.01)

(52) U.S. Cl.
CPC ...... *H01J 37/3405* (2013.01); *H01J 37/3426* (2013.01); *H01J 37/3435* (2013.01); *H01J 37/3438* (2013.01); *H01J 37/3441* (2013.01); *H01J 2237/332* (2013.01)

(58) Field of Classification Search
CPC ............... H01J 37/3435; H01J 37/3438; H01J 37/3441; H01J 2237/332; H01J 37/3414; H01J 37/3432
See application file for complete search history.

(56) References Cited

U.S. PATENT DOCUMENTS

| | | | | |
|---|---|---|---|---|
| 2006/0193997 | A1* | 8/2006 | Bykanov | ............ G03F 7/70033 |
| | | | | 118/720 |
| 2009/0068503 | A1* | 3/2009 | Yamazaki | ........... C23C 14/3414 |
| | | | | 429/502 |
| 2014/0048818 | A1* | 2/2014 | Saito | ....................... H01L 31/00 |
| | | | | 438/47 |
| 2015/0060262 | A1* | 3/2015 | Hollars | ................. C23C 14/352 |
| | | | | 204/192.12 |
| 2017/0145589 | A1* | 5/2017 | Kim | .................. H01L 21/02631 |

FOREIGN PATENT DOCUMENTS

| | | | | |
|---|---|---|---|---|
| JP | 2010111884 A | * | 5/2010 | ......... C23C 14/3428 |
| WO | 2013/023173 A2 | | 2/2013 | |
| WO | 2018/025036 A1 | | 2/2018 | |
| WO | WO 2018/025036 | * | 2/2018 | ............. C23C 14/34 |

OTHER PUBLICATIONS

JP-2010111884-A Translation (Year: 2010).*
International Search Report for PCT/EP2019/078675 dated Jan. 30, 2020.
Written Opinion for PCT/EP2019/078675 dated Jan. 30, 2020.

\* cited by examiner

LIQUID SPUTTER TARGET

The invention refers to a sputter device to sputter a liquid target, to a vacuum system comprising such a device, to a method for depositing a film by sputtering a liquid target, and a method which is part of manufacturing of a semiconductor device.

TECHNICAL BACKGROUND OF THE INVENTION

A scheme of a vacuum coating system 10 comprising a sputter device 1' as known from the state of the art is shown in an exemplary way in FIG. 1. The system comprises sidewalls 12, a cover 11 and a bottom which form the vacuum chamber 38 of the system. The system is a face down system, which means that at least one substrate holder 14, is mounted in or at the cover 11 to position a substantially flat substrate 14 face down in line of sight to a target surface 4 of a liquid target 3, to expose the substrate face to a sputter-plasma, the latter being confined and directed by a magnetic field 6 generated by an unbalanced magnetron magnet system 5 mounted on or in the lower surface of a target trough 2 which contains the liquid target 3. The liquid target material 3 may be Gallium (Ga). The unbalanced magnetron magnets 5 enhance a higher plasma density near the surface of the substrate 14. The trough 2 is electrically connected via a vacuum tight fed through to the cathode (+) of a sputter power supply 23 when a DC-power supply is used, or to a pole (≈) of an RF-power supply. Alternatively, a mixed power supply delivering a DC-component as well as an RF-component may be used. The second pole of the power supply is grounded. To dissipate excess heat from the sputter process the trough is fixed by clamps 9', screws or similar to a cold surface of a cooling device 9. Covering the upper surface respectively the outside of the sidewalls of the trough 2 a grounded anode 7 respectively an anode shield 37 is mounted electrically isolated from the trough in a dark room distance according to the process pressure applied. A vacuum pump 19 is mounted to a pump-port 20 which can be opened and closed by a pump valve 20'. The substrate can be transferred into or out of the system 10 by a substrate port 13 which can be a load lock for stand-alone systems or multi-chamber-systems operated with different pressure levels between successive process or transfer chambers. Finally, a gas inlet 21 is provided to introduce argon as sputter-gas and nitrogen as reactive gas to deposit a GaN layer on a surface of the substrate 14.

It is an aim of the present invention to provide an alternative sputter device and vacuum system as well as a method for depositing a film by sputtering a liquid target which is especially adapted to manufacture a semiconductor device.

SUMMARY OF THE INVENTION

In accordance with a first aspect the invention is aimed to a sputtering device to sputter a liquid target comprising a trough to receive a liquid target material, whereby the device further comprises means to stir or agitate the liquid target material, the means being configured to degas the liquid target material or/and to dissipate solid particles or islands on a surface of the target or/and to move such particles or islands from an active surface region $S_A$ to a passive surface region $S_P$ and or to move such particles or islands from an inactive surface to an active surface. Hereby it is understood that an active surface region $S_A$ is a surface region where target atoms can be sputtered away when sputtering is performed whereas on a passive surface region $S_P$ sputtering does not proceed as strong as in the active region or is completely avoided. With reference to an active surface region $S_A$ surface sputtering of a passive surface region $S_P$ is reduced to a sputter rate of at least 50%, or at least 20%, or even 10% or less of the active surface region $S_A$. As mentioned particles or island may as an example be compound particles, which may also comprise alloy compounds. In short alloys, or respective islands caused by a reactive sputtering process comprising surface compounding, which may also comprise surface alloying, of the liquid target. There may occur transition surface regions in between where sputtering declines into the direction of the passive surface region $S_P$ and vice-versa. An inventive sputtering device may further comprise magnets configured in an essentially planar magnetron system on or preferably recessed in the reverse side of the trough or at or in the bottom of the trough below the liquid level of the target. To generate a magnetic field the magnetron system comprises an outer closed magnet loop which is essentially perpendicular to the target surface with its magnetic axis $M_A$, and encloses the inner magnet(s) of inverse polarity being arranged in a central region of the target and vertically oriented with it's magnetic axis $M_A$. It should be mentioned that outer magnet(s) can be also arranged having a slightly oblique magnetic axis $M_A$ tilted towards or against a central vertical axis, e.g. between 5 and 15°, to further design the overall magnetic field. The outer magnet can be, e.g. a ring-magnet or respectively arranged smaller magnets. The inner magnets, if more than one magnet is used, may be arranged linearly, or again as a closed loop, e.g. including linear and/or curved sections, for rectangular or other elongated targets, or as a central pole for square or circular targets, with all types essentially parallel but inverse to the magnetic axis $M_A$ of the outer magnet loop. Hereby an essentially surface parallel magnetic field and an active surface region $S_A$ the so called "race track" is formed between magnets of different polarity, which means between the projection of the upper poles of the magnets in the target surface whereas passive surface region $S_P$ are outside the race track, at the periphery of the magnetron system or in a central area of the magnetron system, e.g. where magnetic field lines cross the target surface vertically or at least partially vertically. Due to their higher magnetic field strength permanent magnets, as e.g. NdFeB—, CoSm—, AlNiCo— as well as FeCoCr-alloys were used, however electromagnets can be applied to modulate the overall field of the magnetron system. The position near to the target surface of the permanent magnets, recessed in the reverse side of the trough or even in the liquid target enable an effective horizontal and vertical convection of the liquid target material during sputtering, as far as the liquid is provided with sufficient depth in the trough, e.g. at least 6 or 8 mm. Where components of the magnetic field within said active area are mainly horizontal, e.g. more than 50%, 60% or 80%, whereas components of the magnetic field that are in said passive areas are mainly vertical, e.g. more than 50%, 60% or 80%. The areas of the respectively horizontal or vertical magnetic field both comprising also an area of respective field orientation within the target below the liquid surface and at least near above the surface, e.g. 3 mm, 5 mm, 10 mm or more below and above. Additionally, also for non-magnetron sputter devices passive surface region $S_P$ can be provided by dark room shields or an anode formed as a darkroom shield and thereby protecting such shielded surfaces against sputtering or other different types of, e.g.

parasitic glow discharges. It should be mentioned that stirring and agitating or to stir and to agitate are used in the following in the usual identical sense of mixing or moving a liquid, e.g. around, whereas the term stirring-unit is used for a unit to mix or move a liquid by mechanical means comprising also ultrasonic means, whereas the term agitating-unit is used for a unit to mix or move a liquid by use of Lorentz force, which is a magnetoelectric phenomenon. Lorentz force phenomena occur inter alia with moving electrical charged particles in a magnetic field orthogonal to the direction of the movement of the particle which effect a lateral diversion of respective particles according to the left-hand rule for positive charged particles or according to the right-hand rule for negative charged particles.

Degassing here, apart from the general meaning of the word, also means to avoid the formation of gas bubbles in the liquid target material, e.g. due to inclusion of process gas, or at least to prevent the bursting of gas bubbles during the sputter process.

Convection herewith is used within the common meaning of externally enforced fluid movements, e.g. in the context with Lorentz-force or mechanical stirring effects.

Metals or alloys are materials consisting of one or at least two metallic elements, however within the meaning of the present invention also metals or alloys comprising one or more dopants up to a concentration of about 1 at %, or at least 0.5 at % are referred to as metals. Such dopants may be as an example for the metal Gallium (Ga): Al, Ag, Au, Cu, Hg, In, Sn, Zn or C.

The target can be electrically connected to the cathode of a DC-power supply or a pulsed DC-power supply or to one pole of an RF-power supply, or to one or several power supplies providing a respective DC/RF-mix or DC/pulsed DC-mix, or DC/RF/pulsed DC-mix.

The sputtering device may comprise an anode electrically isolated from the liquid target, the anode usually being arranged circumferential round the target and/or in special cases in a central region of the target.

At least a part of the passive surface region ($S_P$) may be projected by a darkroom shield, e.g. a grounded shield or an anode shield mounted within the sheath width, electrically isolated from the target. Thereby the darkroom distance between the projecting shield/anode and the target surface is chosen to be within the sheath width of a sputter darkroom, that is from 0.5 to 12 mm, or 0.5 to 6 mm for usual sputter processes having a process pressure from about $1 \times 10^{-5}$ mbar to $1 \times 10^{-2}$ mbar.

A bottom of the trough can be formed at least partially concave at least in a peripheral region to compensate for the high surface tension of liquid metals, center the liquid material and create a large flat target area. Alternatively, the bottom of the trough can be formed at least partially convex at least in a peripheral region to provide more material in the active area or in the race track.

The means to stir may comprise a stirring unit comprising a stirrer positioned in the liquid target material and a drive mounted at or near the reverse side of the trough, e.g. in a central area of a horizontal projection of the liquid target. The stirrer should be completely covered by the liquid target material if alloying or doping of the coating by the material of the stirrer should be avoided. The stirrer may be one of a rod-type, a disk-type, a paddle-type or an impeller and can be connected to the drive by a transmission axis. The transmission axis comprises a sealing against leakage of the liquid target material, and a vacuum seal if the drive is to be positioned on atmosphere.

Alternatively, the drive may comprise a magnetic unit configured to create a rotating electric field and the stirrer comprises a magnetic bar or is a magnetic stir bar.

In an alternative embodiment the stirring unit may comprise an ultra-sonic source.

Alternatively to mechanical stirring means to stir the liquid target the device may comprise an agitation unit having an inner and an outer agitation-electrode and a magnet system, which can be the magnetron system, or the magnetron system in combination with other magnets, whereby at least the inner agitation-electrode is below the liquid level of the target material, at least the inner agitation electrode being connected to a DC-current source or a low frequency AC-current source. Thereby a DC-current can be applied between the agitation-electrodes to generate a circulating movement of the target liquid at least between the agitation-electrodes by Lorentz force as explained above. Alternatively, the magnetic field of the magnetron magnets may be set in such a way that it results in sufficient Lorentz-Forces due to the currents flowing through the plasma into and in the target, e.g. the magnetic fields are partially closed loops between the inner and outer poles (underneath or in the target) and the plasma current is orthogonal to the target surface. Alternatively, a standing wave could be generated by applying a low-frequency (1-100 Hz) AC-current, which might be useful for degassing as an example.

When at least one agitation-electrode is electrically separated from the sputter electrodes (e.g. anode and cathode of the target) a further DC-current source or the as mentioned low frequency AC-current source has to be used and at least the inner, or both, or in special cases only the outer agitation-electrode are at least in part below the liquid level of the target material. If alloying or doping of the coating by the material of separated agitation-electrodes should be avoided, they may be completely immersed in the target liquid to avoid that electrode material is sputtered away together with the target material. However, by exposing a part of an agitation-electrode comprising or being made of dopant material to the sputter plasma, such electrodes can be uses as material sources to dope coatings produced with the liquid target.

As for the geometry of agitating-electrodes, the outer electrode may be near the outer circumference or confine the outer circumference of the active region $S_A$ of the liquid target material against an outer passive surface region $S_P$ of the target; the inner electrode can be a linear or spot like electrode in a central area of the liquid target or may confine the active region $S_A$ of the liquid target material against a central passive surface region $S_P$; alternatively the electrodes can be arranged along an outer and/or an inner side of the magnetron racetrack, below the surface of the liquid target material and/or confining inner and/or outer passive surface regions $S_P$. With such arrangements of electrically separated agitation- and sputter electrodes, as an example the sputtering can take place by RF-sputtering, meanwhile the agitation of the liquid material can be performed by a DC-current provided by the agitation electrodes. Outer and inner agitation electrodes are set to different electrical potentials and can be formed as respective continuous electrodes, as e.g. in the form of a closed loop or a linear electrode, or alternatively be provided as respectively arranged inner and/or outer electrode arrays composed from several single electrodes of the same or different geometry.

In a simpler arrangement however, surprisingly even one agitation electrode has proofed to be sufficient when a DC-agitation current has been superposed to an HF—, e.g.

an RF—, or a pulsed DC sputter-voltage applied to the liquid target. In this case the sputter-anode also served as outer counter electrode of a central agitation electrode. Even more surprisingly such effects could be also produced by driving the sputter electrodes by a DC-power supply alone.

Such effects could be also attained with sputter electrodes comprising a pot-shaped target-electrode (trough) containing the liquid target material and being connected to the cathode of a sputter power supply, and a grounded counter electrode which is the sputter anode being electrically isolated against the target, respectively the target electrode and covering at least the circumferential region of the pot-shaped target electrode similar to a dark room shield, which is in a distance from 0.5 to 20 mm from the target. Thereby the anode is at the same time the outer agitation-electrode and the cathode (here the pot-shaped target electrode which forms the trough) is at the same time the inner agitation-electrode when the target is DC-driven or RF-driven and DC-superposed. In case of a DC-superposed operation reverse of anode and cathode is possible whereby flow direction can be reversed.

The Liquid target material can be at least one of or an alloy of one of the following materials: Ga, GaAs, GaIn, GaAl, InAl, TiGa, Hg, or an amalgane like HgAg, HgAu, HgCu, HgIn, HgSn, HgZn.

Further on the device may comprise means to heat or to cool or to heat and cool the target. Such means may comprise a liquid cooling and/or heating circulation within the pot-shaped target electrode itself or a heating/cooling plate to which the target electrode is firmly and thermally conductive attached, e.g. by screws, clamps or similar. Therewith certain target materials can be heated to or above the melting temperature or can be more efficiently degassed before or in an initial phase of the sputtering process, and can then be cooled during sputtering if a heating and cooling circulation is provided with the device which can be switched according to the process needs. Alternatively, heating can be provided by a radiation lamp, other radiation devices (e.g. carbon heater), by the plasma itself, or by electron bombardment of the surface of the target material.

The material of the trough may be stainless steel, e.g. 316 British or 2343 Swedish standard, Molybdenum (Mo), a Molybdenum alloy, or graphite.

In accordance with a second aspect the invention is aimed to a vacuum coating system comprising a sputtering device as described above, whereby the system comprises further at least a sputter gas-inlet for an inert gas and a vacuum pump. Additionally, an inlet for reactive gas can be provided, whereby the inlet for reactive gas may comprise different inlets, e.g. near the surface to be coated, whereas the sputter gas-inlet is in close proximity to the target surface.

In accordance with a third aspect the invention is aimed to a method for depositing a film on a substrate whereby at least one first liquid component is sputtered by a sputtering device as mentioned above. The sputtering device comprising a liquid metallic target material placed in a target trough and sputtered from the target to the surface of a substrate to be coated. The substrate being mounted above and opposed to the sputtering device, with the surface to be coated in line of sight to the active surface region $S_A$ of the target, the target comprising at least an active surface region $S_A$ exposed to sputter ions and a passive surface region $S_P$ at least 50% less exposed to sputtering as the active surface region $S_A$. Further on the method comprises agitation of the liquid target to degas the liquid target material or/and to dissipate solid particles or islands or/and move solid particles or islands from the active surface region $S_A$ to the passive surface region $S_P$ or vice-versa.

The method may further comprise the forming of a film which is a metallic, an alloy, or a compound film, whereby at least one first component is sputtered from the liquid target to the surface of the substrate to be coated and in case of a compound at least one second component of the compound is introduced as a reactive gas to form the compound in the gas phase or/and on the surface of the substrate. Thereby the compound or the alloy has a melting point which is higher than the liquid component and may tend to form solid particles or islands on the surface of the target.

To avoid malfunctions or disruptions of the sputtering process the passive surface region $S_P$ should be provided in a peripheral or/and in a central area of the liquid target surface. At least a part of the passive surface region $S_P$ may be projected by a darkroom shield, electrically isolated from the target to shield the region $S_P$ against sputtering or other glow-discharge phenomena.

The shield may thereby form a counter electrode, e.g. anode of the target, which may be formed by grounding the shield.

The sputtering device may be a magnetron, comprising a magnetron magnetic system, and a DC-power supply and/or an RF-power supply.

The agitation of the liquid target can be performed by mechanical stirring, by stirring induced by a current flow and a magnetic field being at least in part orthogonal to the current flow, and/or by applying ultrasonic waves to the liquid target or by a combination of stirring and applying ultrasonic waves, which can be produced, e.g. by one or several ultrasonic sources integrated to or attached to the bottom or sidewalls of the trough. Whereby when stirring is produced by current flow and as mentioned in part orthogonal magnetic field, the current flow can be superimposed to a sputter voltage, or can be directly induced in the target by the sputter-voltage, or be generated as a combination thereof, whereby the magnetic field can be generated by the magnetron system or the magnetron system and further magnets, e.g. side magnets.

When stirring is performed by a stirring unit the unit may comprise a stirrer and a drive mounted at or near the reverse side of the trough. Thereby power transmission between drive and stirrer can be performed mechanically, e.g. by a transmission axis connecting the drive and the stirrer, or magnetically, e.g. by a rotational magnetic unit or a respectively controllable electromagnet in the drive, which both can create a rotating electric field, and a magnetic stirrer which comprises at least one magnetic bar or is a magnetic stir bar.

Further on agitation or stirring can be performed alternatively by an agitation unit comprising an inner and an outer agitation-electrode, both being connected to a DC-current source, whereby a DC-current is applied between the agitation-electrodes to generate a circulating movement of the target liquid at least between the agitation-electrodes due to a Lorentz force resulting from orthogonality of the current flow and a magnetic field, which can be externally applied, e.g. by the magnetron-magnets or/and other magnets, or/and is induced by the DC-component of the plasma current. In a special and constructive simple embodiment of the invention the unbalanced magnetron system in combination with a sputter power supply can be used to produce a current in the liquid target which provides a magnetic field high enough to enable sufficient agitation of the liquid target to degas permanently during the sputter process and avoid any splatters by bursting gas bubbles. In another embodiment the inner or the outer agitation-electrode or both can be positioned within the liquid of the target, e.g. below the liquid level of the liquid target to avoid doping with electrode material, or in part above the liquid level of the target if doping with the electrode material should be desired.

The target material can be a liquid metal or an alloy of at least two metals having a melting point TM≤300° C. or TM≤70° C. or TM≤40° C. Specifically the target material can be one of Ga, GaAs, GaIn, GaAl, InAl, TiGa, Hg, HgAg, HgAu, HgCu, HgIn, HgSn, HgZn.

The layer deposited at the substrate can be a metallic layer, e.g. having essentially, which means within plus/minus 10%, or plus/minus 5% of the target composition, the same composition as the target material, or a compound layer, e.g. a nitride, a carbonitride, a carbide, an oxide, a boride or an alloy of, respectively with the liquid target material or a mixture thereof. Again, the quotient of the metallic elements will be essentially the same as in the target material. Specifically, the compound can be a nitride of one of Ga, GaAs, GaIn, GaAl, InAl, TiGa.

Alternatively or additionally, a further target from a different material, e.g. a solid target, can be used to deposit a compound layer at the substrate surface by co-sputtering.

The following lines describe a common principle for liquid targets, which therefore could be applied also to state of the art methods and systems to sputter liquid target materials. However this principle, which has been found surprisingly by comparison of current-voltage characteristics of the sputter discharge with different liquid levels, can also be used favorably in a further embodiment of the present invention, e.g. by comprising a method to indicate the liquid level LL of a liquid target, a method to refill a liquid target, and a liquid sputter device or a system comprising a liquid sputter device having a respective liquid level indication and/or liquid refill system for the liquid target.

Therefore a method is disclosed to use a dependency of one of the electric values: the sputter voltage, the sputter current, or the sputter power from the liquid level of a liquid target to produce a liquid level signal SLL by measuring the value V1 and comparing it with a benchmark value V2 corresponding to a defined liquid level, whereby value signals S1 and S2 can correspond to the respective measured value V1 or V2 or to a respective transformed values. Transformation can comprise transforming to an other value of the same electric quality, e.g. a smaller voltage, current, power or transformation to digital values for usually data processing systems. The liquid level signal SLL can be used for a liquid level indication and/or a signal for an automatic liquid refill system, which can be activated automatically or by operating staff, e.g. between deposition processes, when sputter power is off. Furthermore a liquid sputter device or system is disclosed comprising a measurement device to measure a sputter value and an electronic device with a comparator, whereat one input $I_V$ of the electronic device is connected with the output signal or a transformed output signal of the measurement device and the comparator, whereas the other input of the comparator is connected with an output of an electronic benchmark database to compare signals S1 and S2 to produce a liquid level signal SLL at the output O of the electronic device. In a further embodiment of such sputter devices or systems, the output of the electronic device can be connected to a liquid level indication device and/or to a refill device of the system.

For such comparative measurements, benchmark values V2 and respective output signals S2 for different liquid levels have to be determined under constant current, voltage or power conditions in a preceding step for every trough configuration, e.g. geometry, to be stored electronically as look up tables and/or as computer implemented algorithm to allocate output signals S1 to respective benchmark signals S2 and to output the correct liquid level signal SLL.

An electronic comparator can be used to compare respective value signals within a controller, computer or other electronic devices comprising a look-up table and/or an algorithm to compare the benchmark and sputter voltage, e.g. after digital conversion. As examples for measuring an electric value relevant for sputtering, the measurement device can be electrically connected between the cathodic trough and ground potential to measure the sputter voltage, on the other hand sputter current or at least an equivalent of the sputter current can be measured within the circuitry of the sputter power supply, whereas sputter power usually is the electrical quantity which can be set constant with the power supply Therewith for practical reasons usually liquid level detection will be implemented with constant power and one of the voltage or the current value will be varied, the other will be measured and/or calculated in dependency thereof.

BRIEF DESCRIPTION OF THE DRAWINGS

The invention shall now be further exemplified with the help of figures. The figures show:

FIG. 2 shows a schematic drawing of an inventive sputter device comprising a mechanical stirrer 25, driven by a drive 28 via an axis 26. The axis 26 is guided by a liquid tight, and in the case the trough bottom forms a part of the bottom of the vacuum chamber, also a vacuum tight feedthrough 27 in the bottom of the target trough 2. Otherwise as obvious to the man of art a respective vacuum tight feedthrough has to be provided in the bottom of the vacuum chamber of the system. By setting the stirrer to work, the liquid material of the target is stirred and the static surface 4 of the liquid turns to a dynamic surface 4' symbolized by its waveform. Actual dynamic surfaces 4' however will rather be formed vortex-like at least with embodiments as drafted in FIGS. 2 and 3. The bottom of the trough 24 can be formed concave as shown in the figure or convex as mentioned above at least in a border area of the trough-bottom and symbolized by dotted lines 24' or be completely concave, as symbolized by dashed lines 24" or completely convex to compensate for the high surface tension of liquid metals which might otherwise cause non-wettable surface areas in and near the circumferential inner edge of the trough and thereby forming gas pockets under the liquid surface, which might effect gas break through during the sputter process. For better heat dissipation a liquid circuit 36 can be implemented directly into the trough-bottom and be combined, e.g. with a closed cycle cooling system. Alternatively a combined heating and cooling system can be used to temper the target material between and/or before sputter processes take place, which has the benefit that target materials having a higher melting point, e.g. above room temperature, can be liquefied before sputtering takes place and thereby avoid local and critical phase shift during the sputter process, e.g. on the surface of the target. Before or in the beginning of the sputter process, e.g. in dependency of the sputter power or a temperature output of a temperature measurement device, not shown, which can be placed in a side wall of the trough, the heating and cooling system can be switched from heating to cooling. The anode 7 may project above a border area, e.g. a circumferential border area of the liquid target 3, and thereby form a passive surface region $S_P$. Swivel-mounted shutter 45 facilitates to protect the substrate surface against unintentional coating, e.g. during initial sputtering to clean or degas the liquid target. Such shutter can also be realized as iris-wheel, or slide shutter.

Figure 1:
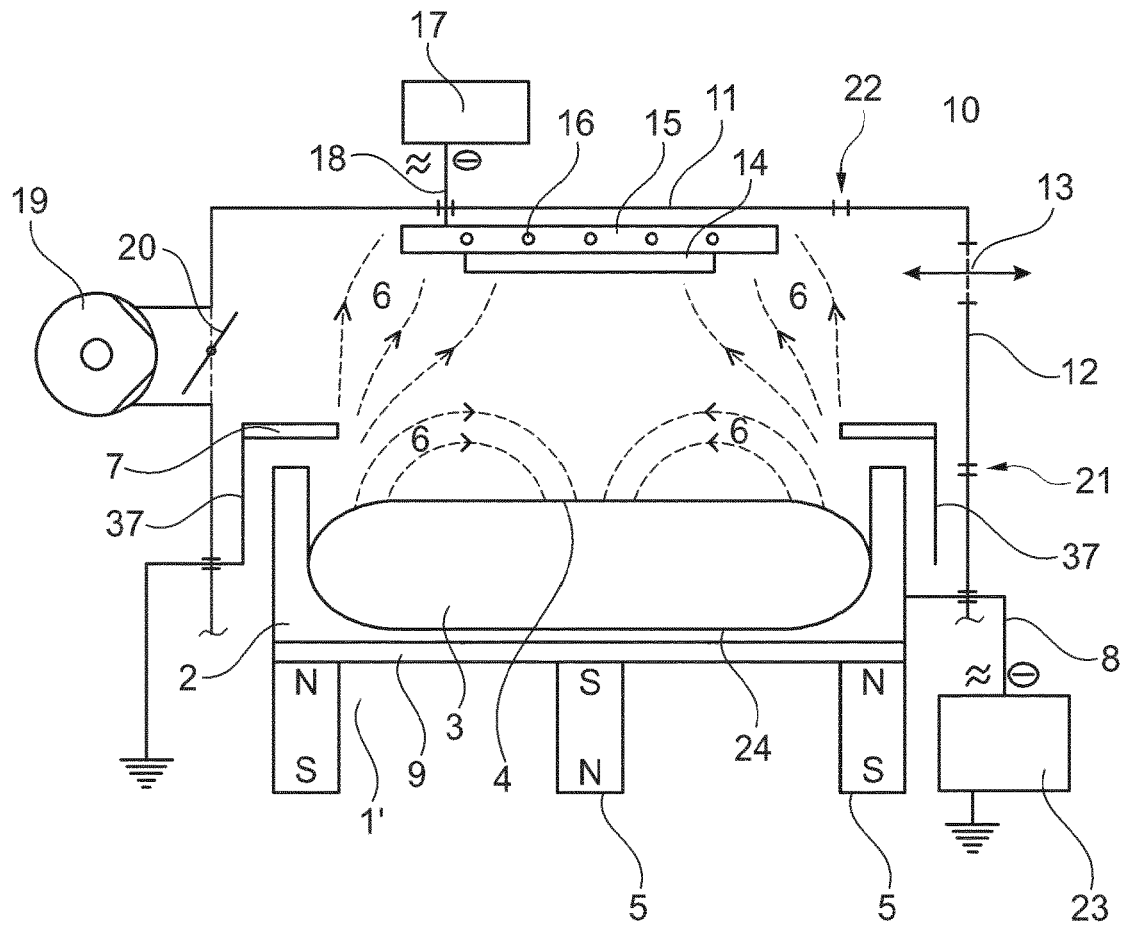
FIG. 1: A vacuum system comprising a sputter device according to the state of the art.

As mentioned features like shutter(s), concave or convex trough bottom 24', 24'', liquid circuit 36, provision of a heating and cooling system and the like as mentioned above can be useful for any embodiment of the present invention even when no explicit reference is made to it.

The same refers to certain additional features which can be applied to the vacuum coating system 1 to make deposition processes comprising an inventive sputter device even more efficient. Such features, which have been superimposed to the vacuum system in FIG. 1 for ease of use, are a separate reactive gas-inlet 22 in the cover 11 of the vacuum chamber, means 17, 18 for applying a bias to the substrate holder and means to cool and/or heat 16 the substrate holder, respectively the substrate. It should be mentioned that such features are not known to be disclosed by state of the art documents together in combination with liquid sputtering.

By use of the separate reactive gas-inlet 22 near to the substrate 14 surface, partial pressure of the reactive gas can be reduced, the gas-inlet 21 can be used as inert gas-inlet only and be placed in the height of the target surface 4, 4' allowing a better flushing or protection of the surface 4, 4' from reactive gas. Both measurements can further reduce target poisoning and formation of solid particles or islands on active surfaces $S_A$ of the target surface 4, 4'. Additionally, gas showers may be used along the circumference of the substrate holder 15 for the reactive gas inlet 22 and/or along the circumference of the target for the sputter-gas inlet 21.

The means for applying a bias to the substrate holder may comprise a bias-power supply 17, which again may be a DC (−) but usually at least for non-conductive substrate materials will be a high-frequency (HF), for instance a radiofrequency (RF) power supply, connected via a power line 18 and a feedthrough to the substrate holder 15. The holder 15 on the other hand may comprise a holder-circuit for cooling or for cooling and heating with respective cooling or cooling and heating means. By use of an electrostatic chuck (ESC) clamping and thereby shadowing of certain areas of the substrates 14 surface can be avoided.

It has to be mentioned that essential features of the state of the art sputter device 1', as magnet system 5, power supply 23, power line 8 and the like as shown in and described with FIG. 1 has to be assumed to be present also with FIG. 2 to 5, also if not explicitly shown or mentioned to maintain the clarity of the drawings.

Figure 3:
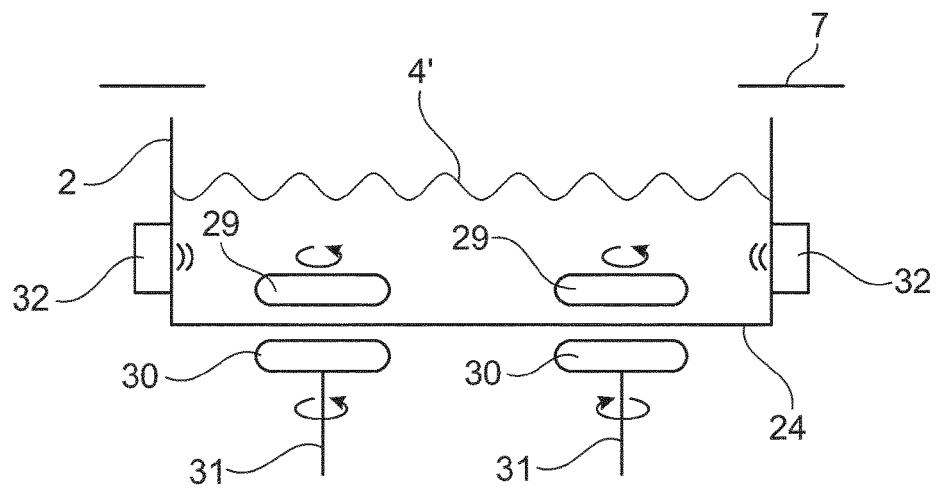
FIG. 3: An inventive sputter device with magnetic stirrers.

FIG. 3 demonstrates a further type of mechanical stirring, showing two magnetic bars 29 positioned in the liquid target 3 which are driven by magnetic stirrers 30 on axis 31. Such stirrers 30 can be replaced in a known way by stirrers using a rotating electrical field instead of further rotating magnets. Such magnetic stirring means 30, 31 can be placed, e.g. within the race track of a magnetron target. Further supporting or stand alone agitation of the liquid target material can be provided by ultrasonic sources 32 mounted at the sidewalls and/or at the bottom of the trough 2 (see FIG. 4).

Figure 4:
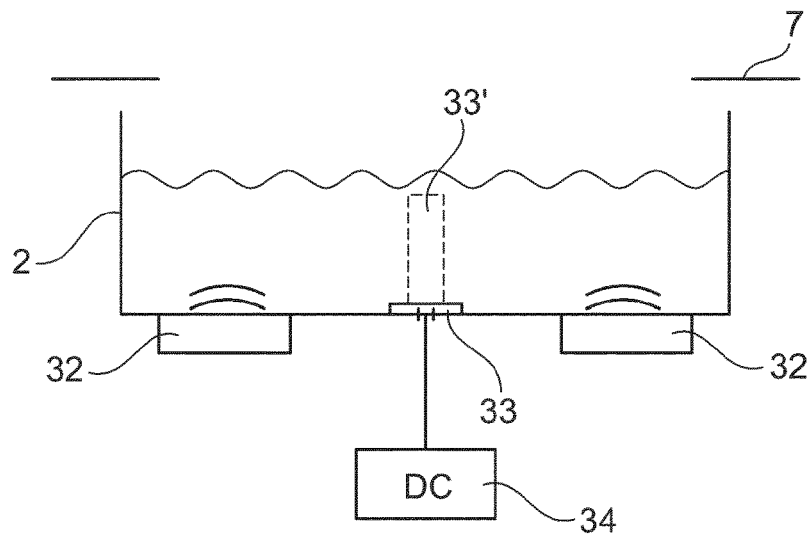
FIG. 4: An inventive sputter device with Lorentz force stirring.
Figure 5:
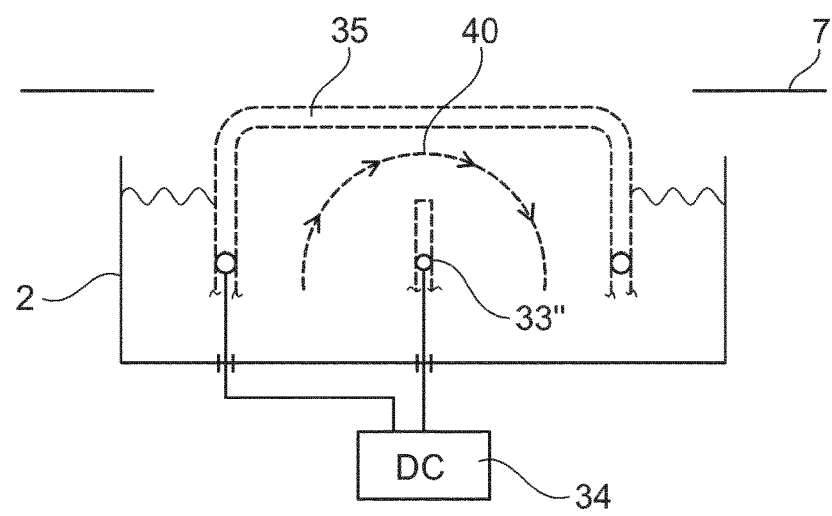
FIG. 5: A further inventive sputter device with Lorentz force stirring.

FIG. 4 and FIG. 5 show a different principle to stir or agitate liquid targets, making use of a Lorentz force phenomenon as explained in the summary of the invention. Thereby FIG. 4 shows a simple set up with a central two-dimensional, e.g. circular or linear electrode 33 or 3-dimensional, e.g. rod or wall like electrode 33' (dashed lines) depending on the target geometry which can be round, square rectangular or otherwise elongated. The electrode is fed by a separate electrode current-supply 34 and is feed through electrically isolated from the trough. The current can be a DC or a pulsed DC current. With this arrangement the anode can have the function of the outer agitation-electrode, with the agitation current flowing from the inner agitation electrode via liquid target and the conductive plasma to the anode. The DC-potential of the electrode can be set between the anode potential, which is usual ground, and the cathode potential of the sputter target, which can be between at least −100 and about −4 kV. Therefor the DC-potential of the agitation electrode can be set from −10 to about −3.9 kV for usual sputter processes. Additional to the magnetron magnets 5, 5', 5'' further magnets 44 can be provided, e.g. as side magnets at the circumference of the trough, to enforce vertical magnetic field components within the liquid target material. Such magnets can be solid permanent magnets or an electric magnet with a magnetic force that can be controlled by the applied current. Such magnets might be arranged as a ring (or any given array of magnets.

A Further embodiment of the invention is shown in FIG. 5 with an inner, here horizontally linear agitation-electrode 33'', and an outer agitation-electrode 35, here in form of a closed loop, as shown in the superposed vertical section in dashed lines. Inner electrode 33'' and outer electrode 35 are connected to different poles of the electrode current-supply 34 in analogy to the connection described with FIG. 4. Such agitation-electrodes can be positioned in parallel to the targets race track to provide a circular or rotational movement along the race track as symbolized by dashed arrows 40. It should be mentioned that rotational direction can be reversed, if polarities of the outer and inner magnetron magnets are reversed. Agitation electrodes 33, 33', 33'', and 35 can be designed in one piece or as split electrodes comprising several electrode sections or sub-electrodes. In another embodiment such electrodes can be designed swivel- or movable-mounted and submersible into the target liquid (not shown). Such embodiments as well as mechanical stirring can be used for instance when agitation should be performed before the sputter process starts or agitation induced by the sputter electrodes does not suffice.

FIGS. 6 to 7 refer to operative inventive sputter devices with Lorentz force stirring, which use the magnetron magnet-field 6 and DC or pulsed DC target currents 42 to stir the liquid target 3. Therefor no separate agitation electrode(s) 33, 35 are needed. Nevertheless, it may be useful to ad one or further separate agitation electrodes, e.g. similar to the examples as shown above. As with FIGS. 3 to 5, only features essential for the understanding of the shown embodiment or present process are shown, whereas for other features, like power lines and supplies, substrate holder, pumping system or the like, which are necessary to run a sputter operation it is referred to FIG. 1 and respective description.

Figure 6A:
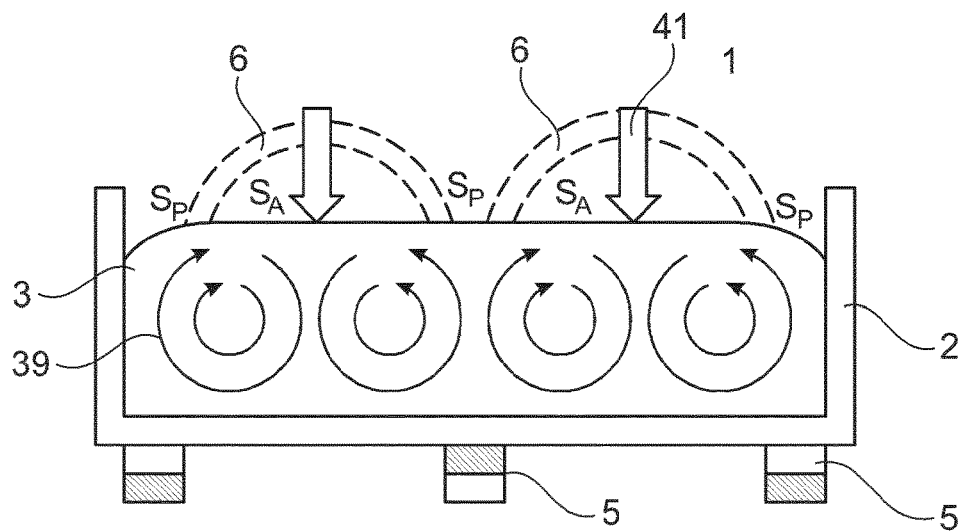
FIG. 6*a-c*: Further inventive sputter devices with Lorentz force stirring.

With FIGS. 6a to 7c a simplified explanation of current induced vertical convection is symbolized by circular arrows 39. It should be mentioned that such vertical convection needs a certain minimum depth of the liquid in the trough, which should be at least 6 mm, however 8 mm or 10 mm or deeper will work better. FIG. 6a shows an inventive sputter device 1 in operation having a trough 2 dimensioned to allow vertical 39, as well as horizontal convection which overlaps with the circular movement 40 in the racetrack as shown in FIG. 5. Both types of convection only symbolize the vertical and the horizontal component of the overall-convection and therefor both have their origin in current(s) and magnetic field(s) applied to the liquid target 2. It should be mentioned that some of the following explanatory information is not based on proven theory but only deducted as a first guess from experimental results and common physical knowledge and might need some further improvement. As symbolized by arrow 41 a plasma current of a pulsed or static DC-driven sputter magnetron discharge enters the target about normal to the surface below the magnetic tunnel of the magnetic field 6. The arrows 41 symbolize the place of the highest current density which corresponds about to the middle of the so called race-track formed on the target surface. Under the presumption that both the liquid target 3 and the trough 2 provide in each case an evenly distributed conductivity, e.g. of at least 0.1 MS/m for metallic or carbon materials like graphite, a current flow as symbolized by arrows 42 will result, see FIG. 7a. The internal current flow in the liquid target 3 together with the magnetic field 41 from the magnet system 5 of the sputter device 1, will produce the current induced vertical convection 39. It should be mentioned that the magnetic field 41 provided by magnet system 5 is, of course also present within the liquid target 3 but is not shown to avoid overloading the drawings.

Figure 2:
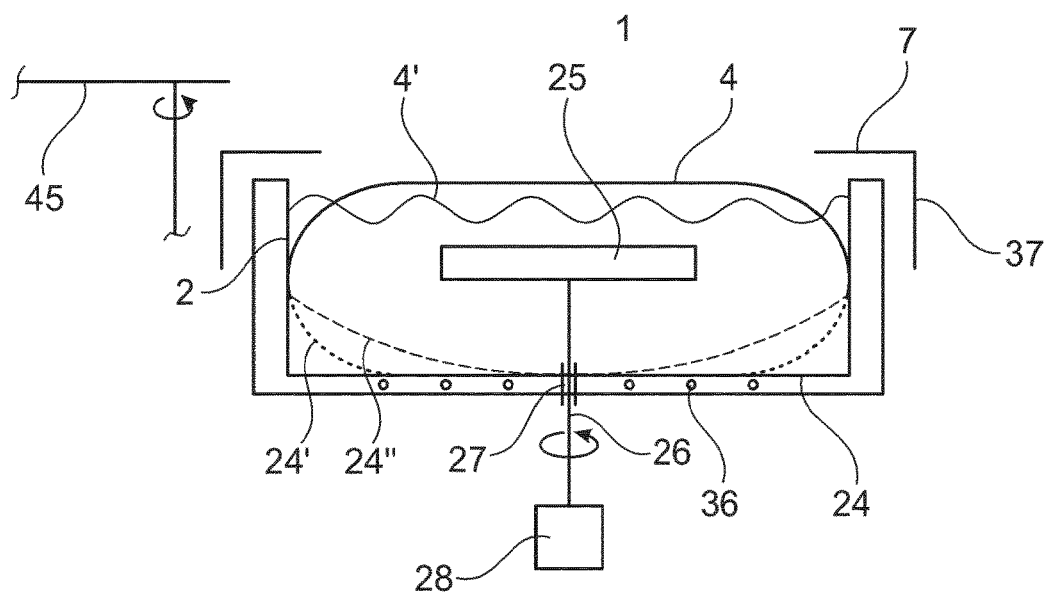
FIG. 2: A scheme of an inventive sputter device.

It has to be further noted that with low induced currents or at least at the beginning of a sputter process, mainly such vertical convection 39, resulting in an essentially linear horizontal movement on the liquid surface could be achieved. Such vertical movement however will continue also with higher currents and will superimpose the horizontal movement to provide an effective agitation of the liquid, as far as the liquid is provided with a sufficient depth in the trough. Thereby liquid at the surface and therewith possible contaminations or surface islands, e.g. from compounds like GaN formed at the surface during a reactive sputter process, are moved from both sides essentially perpendicularly towards the racetrack. Such agitation allows to clean the target under a closed shutter 45 in a first sputter step with low sputter power and resulting low sputter currents in the liquid target, and thereby to start the deposition process only after cleaning has been finished by opening the shutter 45, see. FIG. 2. Furthermore when a reactive sputter process should be applied, which is the usual mode when sputtering liquid targets to coat a substrate, coating parameters like sputter-power and partial pressure of a reactive gas, e.g. nitrogen, oxygen or carbon containing gas like methane can be modified in such a way that the target surface or at least the race track is free from any disturbing solid compounds of a critical size floating on the liquid target. Such particles might cause process irregularities leading to annoying particles on a substrate surface to be coated.

By applying a higher sputter power, e.g. together with a higher flow of reactive gas which can be performed just before opening the shutter for deposition. With higher sputter power and resulting currents, the horizontal component of the Lorentz-power becomes strong enough to enforce also a rotational movement of the target liquid at least within the region of the racetrack. Such superposed horizontal and vertical movements in the target liquid can be used to furnish immediately subcritical small solid compound particles into the race track, which is the most active surface region $S_A$, where they are sputtered away without forming harmful particles on a substrate surface. Thereby forming of particles of overcritical size or solid islands can be avoided effectively at least within active surface regions.

Figure 6B:
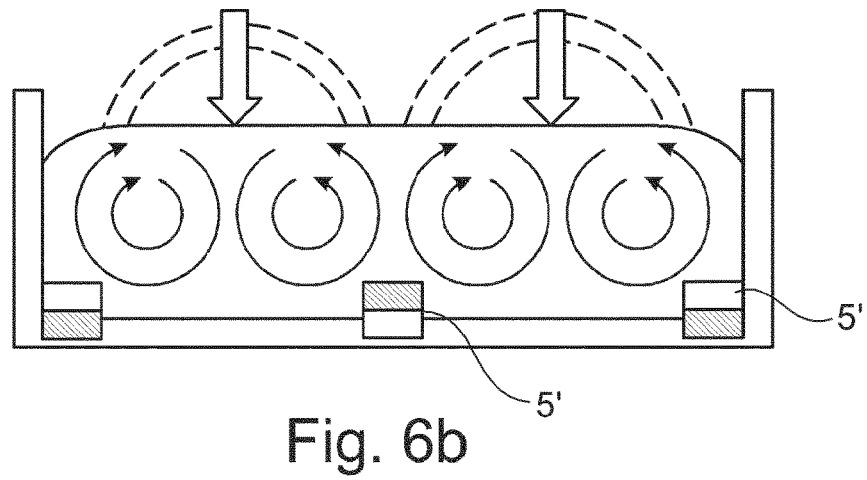
Figure 6C:
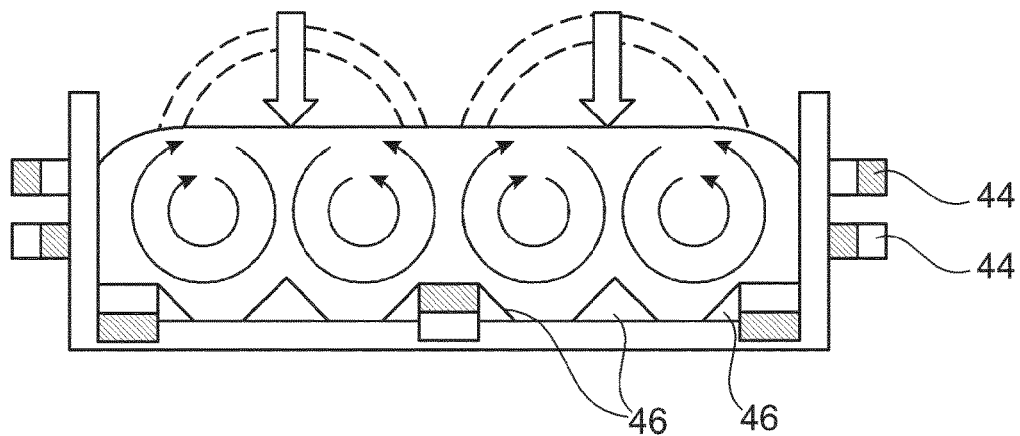

In FIGS. 6b and 6c a further embodiment of an inventive sputter device 1 is shown having it's magnet system 5' mounted in respective recesses in the upper side of the trough bottom 24. Such an embodiment allows better access to the magnet system for servicing. Therewith another magnet system can be implemented for other sputter processes more easily, e.g. for sputtering another type of liquid target material, without the need to dismount the whole trough from the coating system 10. Furthermore, such embodiments allow higher liquid levels due to the higher position of the magnets which allows to reduce service time for material supply. As an alternative to extend such service intervals, a supply of liquid target material can be foreseen allowing to feed fresh target material e.g. by feeding a wire of the respective material (Ga, In, or respectively adapted alloys) into the liquid target, or via a supply pipe from a material supply positioned inside or outside the vacuum coating system (not shown), whereby the feed inlet can be under the surface of the target level. With modifications as shown in FIG. 6a to 6c, FIG. 7a and FIG. 8 below, essentially the whole of the troughs inner surface which is electrically connected to the cathode of the sputter supply, is also in electrical contact with the liquid target, and therewith is used as an inner agitation-electrode. That applies also to magnets 5' at the bottom of the trough as they are electrically conductive and therefor act too as electrode surface. Flow installations 46 as shown in FIG. 6c can be provided to help develop faster or vary a flow pattern from the agitation electrodes. Such installations can be put on as shown or formed in the inner trough bottom or sidewalls. These installations 46 can be too conductive like the trough surface or may be made of or coated with isolating material which gives a further parameter to influence the flow pattern, as will be explained in the following with FIGS. 7b and 7c. Side magnets 44 as shown in FIG. 6c provide a further parameter to influence magnetic field and flow pattern of the liquid movement.

Figure 7A:
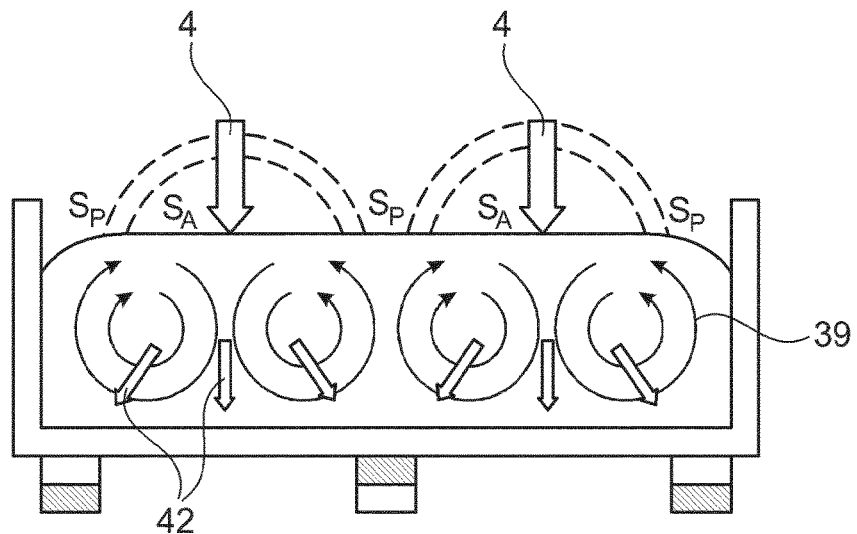
FIG. 7*a-c*: Further inventive sputter devices with Lorentz force stirring.
Figure 7B:
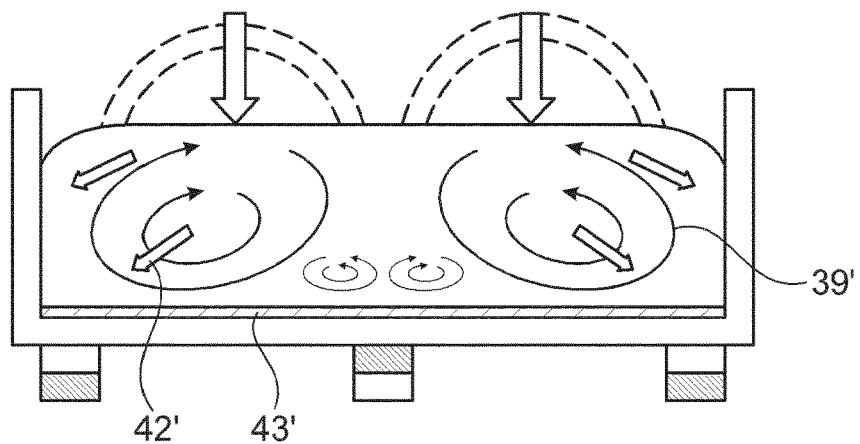
Figure 7C:
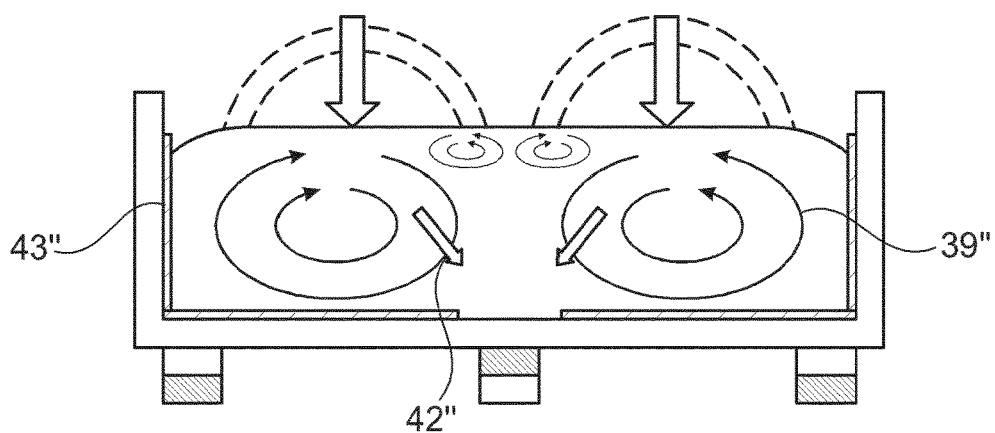

FIGS. 7b and 7c shows sputter devices with a different guidance of the current within the liquid target material 3 as compared to FIG. 7a. With FIGS. 7b and 7c only a part of the inner surface of the trough which is in contact with the liquid target is used as the inner agitation-electrode. Therefor electrically isolating material 43', 43" which is inert against the liquid target material, e.g. Teflon, can be placed as a cover or coating on certain surface areas in the trough. Thereby current flow is varied in the target material as symbolized by arrows 42' and 42" which also provides different flow patterns which are liquid movements 39', 39" in the liquid and on the surface of the target 3. This allows to adapt and optimize agitation and flow design easily within the target according to the actual process needs. An alternative but less flexible and more expensive embodiment would be to take an electrically isolating trough body and provide respective contacts or contact areas on its inner surface. Such use of electrically isolating material 43', 43"

can be also combined additionally with other embodiments, e.g. as shown in FIGS. 1, 4, 5, 6*b*, 6*c* and 8.

Figure 8:
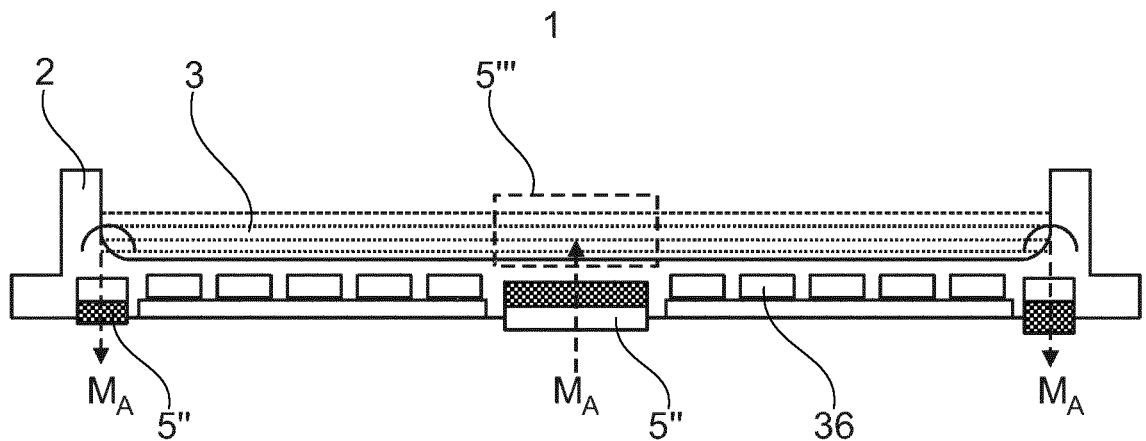
FIG. 8: A further inventive sputter device with Lorentz force stirring.

Sputtering tests to sputter Gallium under inert and reactive sputter conditions have been performed in a water cooled round stainless steel (AISI 1.4301) trough with an inner diameter of 200 mm and 15 mm depth. Within 10 mm of the inner circumference the bottom has been given a concave boarder area up to a height of 5 mm from the bottom to compensate for the high surface tension of Gallium on stainless steel and thereby flatten the Ga-surface within this area. 1.5 to 3 kg Ga have been filled into the trough to a height of about 8 to 14 mm. The magnet system 5" as used was an unbalanced magnetron system mounted in respective recesses in the lower (reverse) side of the trough bottom 24, with magnetic axes $M_A$ of inner and outer magnets vertically but reversed oriented, as shown in FIG. 8. Thereby magnets, respectively the poles of the magnets could be placed near to the liquid surface region, that is in a distance of 17 to 35 mm to the maximum, and a high magnetic flux and parallelism of the magnetic field to the surface of the unstirred target could be provided. Magnetic flux density was measured within the racetrack region at a radius of 75 mm from the trough center about 5 mm above the Ga-surface, whereby the horizontal component Bx was about 0.038 T and the vertical component was about 0.013 T, giving an overall flux |B| of about 0.05 T.

Therefore at this place about 75% of the field are contributed by the horizontal, essentially surface parallel component $B_x$ and only about 25% by the respective vertical component $B_y$. It could be shown that a magnetic field having a horizontal component $B_x$ of at least 60% or even better equal or higher 70% within the race track, respectively within an area of the race track projection within and above for at least 5 to 10 mm distance from the stationary liquid surface could help to agitate the liquid more effectively. Similar strong and surface parallel magnetic fields can be provided e.g. with a configuration as shown in FIGS. 6*b* and *c*, with magnets near to the liquid surface due to their position within the trough. It should be mentioned that side magnets 44 may help but are not a condition to provide such field characteristic.

A further variation which can be used to improve the parallelism of the magnetic field within the liquid gallium target and at least directly above its surface can be to provide a central yoke 5''' made of magnetizable material having a Curie temperature >500° C. in the middle of the target as shown with dashed lines in FIG. 8. Such a yoke can cooperate with magnets 5" to design the magnetic field lines in a more surface parallel way.

It should be mentioned that with magnetic systems 5, 5', 5" (5'''), comprising inner or central magnets and outer magnets with respect to the center of the target, usually a highly unbalanced magnetic field will result due to the higher number or, if a ring-magnet is used, the bigger size of the peripheral magnet(s), especially with reference to a circular target design. Nevertheless within the liquid target and near its surface a nearly symmetric parallel magnetic field can be applied by respective design of the magnetic system as shown.

The process has been divided into two process steps, with the first step behind a closed shutter at low sputter power under inert gas to condition the liquid target by an essentially linear horizontal movement as described above, followed by a second step with higher sputter power under a mixture of inert and reactive gas, whereby the shutter has been opened after a few seconds to deposit a compound layer on a polished wafer substrate. The following parameters have been applied to produce a flawless compound (GaN) layer on the wafer surface.

First Step—Linear Surface Movement for Target Conditioning:
  Flow Ar: 20 sccm
  Flow N2: 0 sccm
  Total pressure: 0.29 Pa
  Sputter power (DC): 50 W
  Sputter current: 0.19 A
  Sputter voltage: 268 V Second Step—Rotational Surface Movement for Coating:
  Flow Ar: 20 sccm
  Flow N2: 10 sccm
  Total pressure: 0.29 Pa
  Sputter power (DC): 600 W
  Sputter current: 1.71 A
  Sputter voltage: 350 V Alternatively the following steps have been applied:

First step—conditioning of the target herewith is performed with high sputter power which provides high steering and heat, both resulting in a very effective degassing of the liquid Gallium, e.g. compared with linear surface movement. A dummy wafer has been used with this conditioning step:
  Flow Ar: 30 sccm
  Flow N2: 60 sccm
  Total pressure: 0.33 Pa
  Sputter power (DC): 1700 W
  Sputter current: 3.7 A
  Sputter voltage: 460 V Second Step—Rotational Surface Movement for Coating:
  Flow Ar: 14 sccm
  Flow N2: 72 sccm
  Total pressure: 0.36 Pa
  Sputter power (DC): 500 W
  Sputter current: 1.33 A
  Sputter voltage: 376 V In the following standard ranges which are applicable and ranges which gave very good results for GaN-coatings are given for every parameter of the coating process:
  Flow Ar: 5-70 sccm, 8-14 sccm
  Flow N2: 0-100 sccm, 5-80 sccm
  Total pressure: 0.1-0.8 Pa, 0.2-0.6 Pa
  Sputter power (DC): 10-600 W, 20-500 W
  Sputter current: 0.05-10 A, 0.08-8.38 A
  Sputter voltage: 200V-800V, 261V-538V It should be mentioned that critical minimal dimensions to agitate a liquid target trough 2 by means of Lorentz-force in a good and reproducible way, seem to be, e.g. an inner diameter of a round or an inner smaller side of a rectangular trough of at least 55 mm or 60 mm and a depth allowing at least a liquid level of 4 mm or 6 mm with projecting edges of at least 8 or 10 mm to avoid spill out of target liquid during agitation or filling. Whereas for the critical maximum dimension a size of 2,000 mm still seems to be manageable with a reasonable effort. For a higher material reservoir liquid levels up to 20 or 30 mm seem to be manageable with respective magnet systems, e.g. on or within the upside of the trough bottom to ensure a manageable distance from the liquid surface.

Due to the symmetric set-up and respective fluid movement, round targets have been proved to be a good solution for inner trough diameters from 100 and 1000 mm, especially from 200 to 800 mm.

Figure 10:
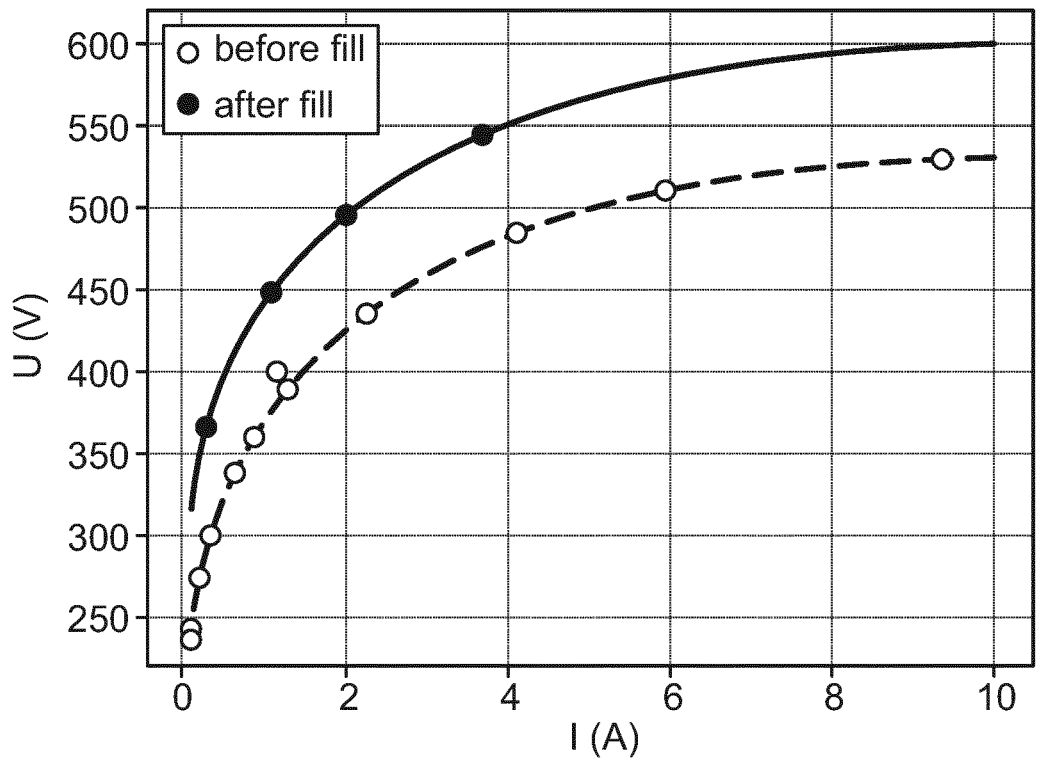
FIG. 10: Voltage/current characteristics.

FIG. 10 shows two typical current-voltage characteristics for a liquid level target as described with FIG. 8. No optional central yoke 5''' has been used. The lower curve has been taken with a low liquid Ga-level in the trough 2, which refers to about 8 mm level above the trough bottom. The upper curve has been taken after refilling the trough with a high liquid Ga-level, which refers to about 13 mm above the trough bottom. Surprisingly it could be shown that the offset of the sputter voltage between the two characteristic curves always had a characteristic constant offset of about 68.70 V and sputtering with a higher liquid level results in a higher sputter voltage and power as far as the sputter current is kept constant. Alternatively when sputter power should be kept constant, e.g. when power control is used to control the target power supply 23, the target current will be lower with a freshly refilled high level target than with a target having a low liquid level.

Without being able to give proof of it by now, this effect is supposed to be due to a more pronounced "dynamo-effect" of the higher rotating target mass which induces a higher electrical resistance to the sputter current flow. Such findings could be used by the inventors to deduce a method and device to continuously monitor the liquid level in the target trough and indicate the need to refill to the operator and/or initiate automatic refill of a low liquid level target between deposition processes.

Figure 11:
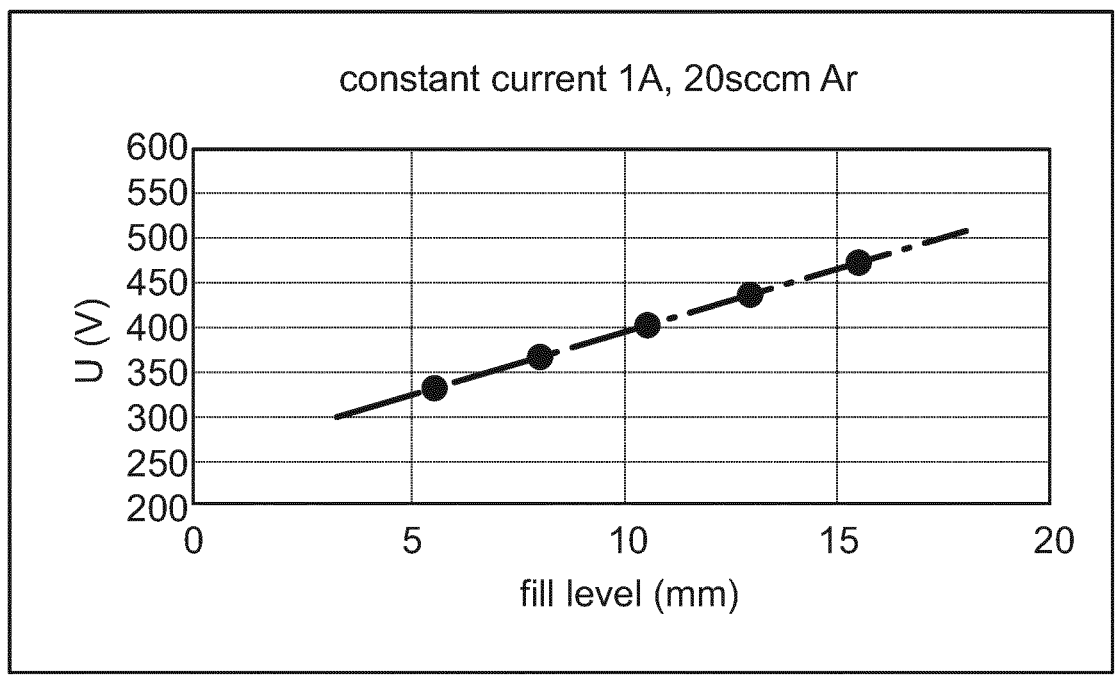
FIG. 11: Voltage/liquid level relation.

In FIG. 11 and the following example of a look up table a simple linear scheme has been extrapolated from the low ("before fill") and high ("after fill") target voltage values at one ampere from FIG. 10.

Lookup Table for constant target current of 1 amper:

| Ga (kg) | fill level (mm) | U (V) |
|---------|-----------------|-------|
| 1.0     | 5.5             | 335   |
| 1.5     | 8.0             | 370   |
| 2.0     | 10.5            | 405   |
| 2.5     | 13.0            | 440   |
| 3.0     | 15.5            | 475   |

Such schemes made for several different target currents and therewith different target power levels could be used in electronic lookup tables serving as a database to indicate the level of the liquid gallium level and output a control signal SLL to control a liquid level refill device. Filling was initiated with about 1.5 kg of gallium left in the target trough on which one kg liquid gallium has been added to a total of 2.5 kg target liquid.

Figure 9:
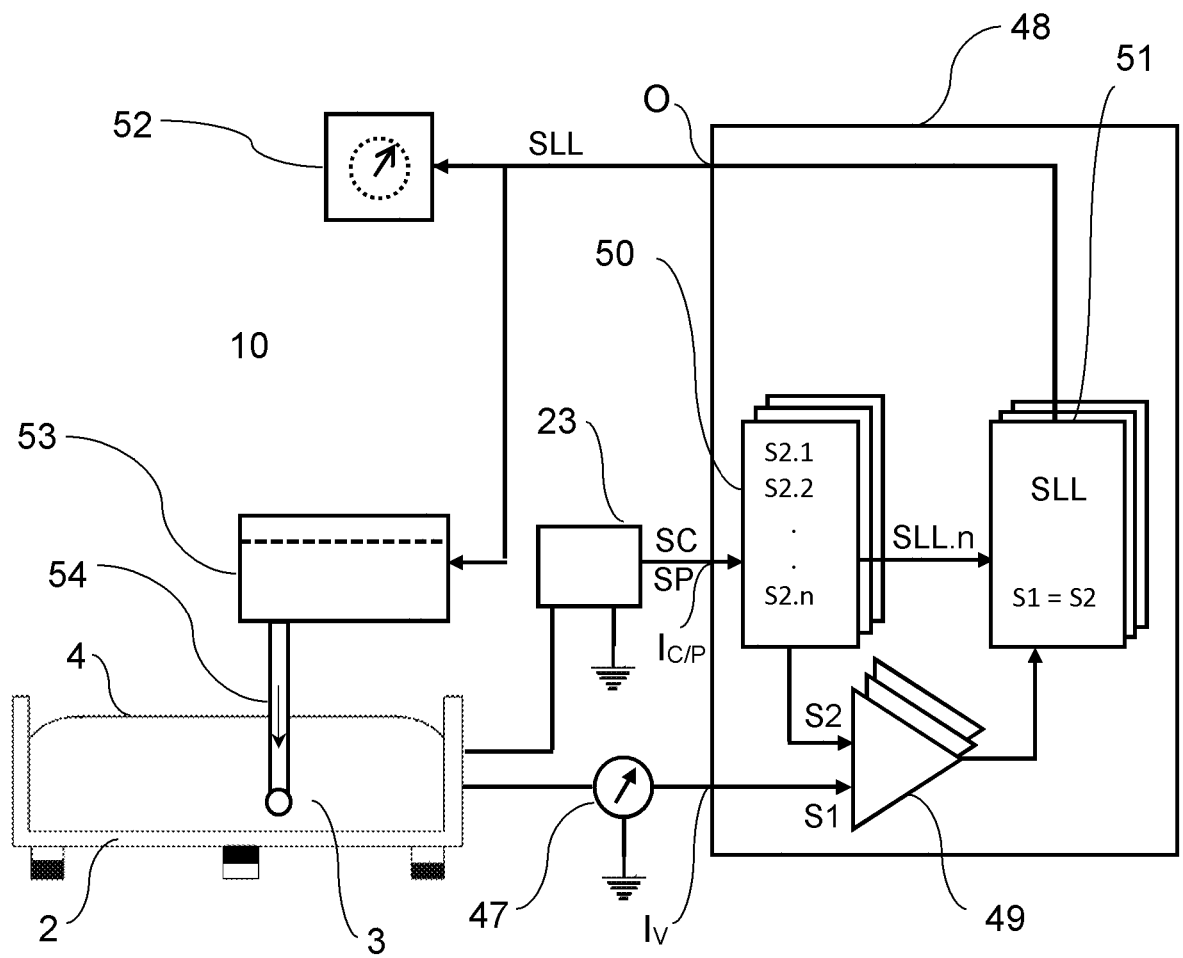
FIG. 9: An inventive device and system comprising a liquid refill system.

A logic scheme to operate a liquid level refill device 53 and monitor the liquid level in the target trough 2 is shown in FIG. 9. A measurement device 47, here to monitor the target to ground voltage is electrically connected between the cathodic trough and ground potential and forwards a voltage signal S1, which usually will be a digitally transformed voltage signal, to one input $I_V$ of an electronic device 48 which is connected to one input of a comparator 49. The electronic device 48 can be a separate controller or a computer to operate the refill device 53 or a control circuit within the system control of the coating system. A second signal S2 is applied to the other input of the comparator 49. The second signal S2 being generated by an electronic lookup table 50 selected in accordance to a respective target current level or range measured within the circuitry of the target power supply 23 and given as current signal SC to an input $I_{C/P}$ of the electronic device 48 to select the respective lookup table 50 for the present current flow. Alternatively, lookup tables can be also foreseen for constant power levels or ranges of the supply 23. In this case a power signal SP, which again will usually be a digitally transformed signal, can be used to select the respective lookup table. Lookup table 50 comprises several values S2.1, S2.2 . . . S2.$n$ according to the required accuracy of the liquid level detection. Such values can be given sequential to one comparator with S1 unchanged or in parallel to a respective series of comparators as shown. With each signal S2.$n$ the respective liquid level value SLL.n is given to a logic element 51 which forwards a respective value SLL to indication device 52 and refill device 53 only when the output signal of the comparator 49 refers to S1=S2. Thereby display of the liquid level with level meter 52 and operation of the refill system 53 can be controlled. The latter comprising a refill channel 54 to fill the target liquid below the liquid surface 4, e.g. sidewise through the trough or in a periphery, e.g. inactive surface region. It should be mentioned that instead of lookup tables also an algorithm or a combination of lookup table(s) and an algorithm could be used to calculate respective SLL signals from basically measured or transformed voltage S1 and current SC or power signals SP.

As mentioned in the common part of the description above any of the electrical values like sputter voltage, sputter current or sputter power can be used to produce or deduce signal S1, one of the remaining values is kept constant and the last value is varied to produce the respective lookup table or find the algorithm which fits to the respective target geometry and plasma regime(s) to produce comparative benchmark signal S2 for different liquid levels.

Despite of the fact that in the forgoing description the invention has been demonstrated by means of various embodiments, any feature as disclosed with one embodiment is assumed to be disclosed with any other embodiment, as long such combination is not obviously conflicting or inconsistent with other features of the respective embodiment for the man of art.

REFERENCE NUMBERS 1, 1' sputter device
2 target trough
3 liquid target
4 static surface
4' dynamic surface
5, 5' magnet system
6 magnetic field
7 anode
8 power line target supply
9 cooling device
9' clamp
10 vacuum coating system
11 cover
12 sidewall
13 substrate port
14 substrate, wafer
15 substrate holder
16 means to cool and/or heat
17 bias power supply
18 power line bias supply
19 vacuum pump
20 pump-port
20' pump valve
22 gas inlet
23 sputter power supply
24 bottom of the trough
24' bottom of the trough partially concave
24" bottom of the trough completely concave
25 mechanical stirrer
26 axis 27 feedthrough
28 drive
29 magnetic bar
30 stirrer
31 axis of the stirrer
32 ultrasonic source
33 central agitation electrode
34 separate electrode current-supply
35 outer agitation electrode
36 liquid circuit
37 shield
38 vacuum chamber
39 vertical current induced liquid movement
40 horizontal current induced liquid movement
41 current flow in sputter plasma
42, 42', 42" current flow in liquid target
43', 43" isolating cover or coating
44 side magnets
45 shutter
46 flow installation
47 measurement device
48 electronic device
49 comparator
50 lookup table
51 logic element
52 liquid level indication device
53 liquid level refill device

What is claimed is:

1. Sputtering device to sputter a liquid target, comprising a trough to receive a liquid target material, wherein the device comprises means being configured to effect at least one of stirring and agitating the liquid target material, degassing the liquid target material, dissipating solid particles or islands on a surface of the target, and moving such particles or islands from an active surface region ($S_A$) to a passive surface region ($S_P$) or vice-versa, the passive surface region ($S_P$) being at least 50% less exposed to sputtering as the active surface region ($S_A$) wherein the means comprise a planar magnetron system with at least an outer and an inner magnet having reversed polarities and being mounted below a liquid level of the liquid target material in respective recesses in a reverse side of a bottom of the trough, which is not in contact with the liquid target, at the reverse side of the bottom of the trough, or at or in a surface of the bottom of the trough being in contact with the liquid target, the planar magnetron system being designed to enable a horizontal and a vertical convection of the liquid target material during sputtering, wherein the means to agitate the liquid target comprise an agitation unit having an inner and an outer agitation-electrode, and a magnet system comprising the outer and inner magnets, whereby at least the inner agitation-electrode is at least in part below the liquid level of the liquid target material, and at least the inner agitation electrode being connected to a DC-current source, a pulsed DC-current source or a low frequency AC-current source.

2. The device according to claim 1, wherein the liquid target can be electrically connected to one of the cathode of a DC-power supply, the cathode of a pulsed DC-power supply, or to one or several power supplies providing respectively one of a DC/RF-mix, a DC/pulsed DC-mix, an RF/pulsed DC-mix or an DC/RF/pulsed DC-mix.

3. The device according to claim 1, further comprising an anode electrically isolated from the liquid target, the anode being arranged circumferential round the liquid target or/and in a central region of the liquid target.

4. The device according to claim 1, wherein at least a part of the passive surface region ($S_P$) is projected by a darkroom shield, electrically isolated from the liquid target.

5. The device according to claim 1, wherein the bottom of the trough is formed concave or convex at least in a peripheral region.

6. The device according to claim 1, wherein the means to stir comprise a stirring unit comprising a stirrer positioned in the liquid target material and a drive mounted at or near the reverse side of the trough.

7. The device according to claim 6, wherein the drive comprises a magnetic unit configured to create a rotating electric field and the stirrer comprises a magnetic bar or is a magnetic stir bar.

8. The device according to claim 1, wherein the outer agitation-electrode is at least in part below the liquid level of the liquid target material.

9. The device according to claim 1, wherein at least a part of the passive surface region ($S_P$) is projected by a darkroom shield, electrically isolated from the liquid target and the outer agitation-electrode is an anode.

10. The device according to claim 9, wherein the inner agitation-electrode is at least a part of an inner surface of the trough being in contact with the liquid target.

11. The device according to claim 10, wherein the inner agitation-electrode is the inner surface of the trough being in contact with the liquid target.

12. The device according to claim 1, wherein the liquid target material is at least one of or an alloy of one of the following materials: Ga, GaAs, GaIn, GaAl, InAl, TiGa, Hg, HgAg, HgAu, HgCu, HgIn, HgSn, HgZn.

13. A vacuum coating system comprising:
the sputtering device according to claim 1;
a sputter gas-inlet; and
a vacuum pump.

14. The system according to claim 13, wherein the system comprises a measurement device to measure a sputter voltage and an electronic device comprising a comparator, one input $I_V$ of the electronic device being connected with the output signal or a transformed output signal S1 of the measurement device and the other input of the comparator being connected with an output from an electronic benchmark database to compare signal S1 and signal S2 from the benchmark database to produce a liquid level signal SLL at an output O of the electronic device.

15. The system according to claim 14, wherein the output O is connected to a liquid level indication device and/or to a refill device of the system.

16. The system according to claim 13, further comprising:
an inlet for reactive gas.

17. A method for depositing a film on a substrate, whereby at least one first component is sputtered by a sputtering device to sputter a liquid target comprising a liquid metallic target material placed in a target trough and sputtered from the target to the surface of a substrate to be coated, and the liquid metallic target material comprises at least an active surface region ($S_A$) exposed to sputter ions and a passive surface region ($S_P$) at least 50% less exposed to sputtering as the active surface region ($S_A$), wherein the method comprises agitation of the liquid metallic target material to degas the liquid metallic target material or/and to dissipate solid particles or islands or/and move solid particles or islands from the active surface region ($S_A$) to the passive surface region ($S_P$) and/or vice-versa, wherein agitation enforces horizontal and vertical convection in the liquid metallic target material during sputtering, wherein the sputtering device comprises a planar magnetron system with at least an outer and an inner magnet having reversed polarities and being mounted below a liquid level of the liquid metallic target material in respective recesses in a reverse side of a bottom of the target trough, which is not in contact with the liquid target, at the reverse side of the bottom of the trough, or at or in the bottom of the target trough being in contact with the liquid target, wherein the sputtering device comprises an agitation unit an agitation unit having an inner and an outer agitation-electrode, and a magnet system comprising the outer and inner magnets, whereby at least the inner agitation-electrode is at least in part below the liquid level of the liquid target material, and at least the inner agitation electrode being connected to a DC-current source, a pulsed DC-current source or a low frequency AC-current source.

18. The method according to claim 17, wherein the film is a metal, an alloy, or a compound film and at least one first metallic component is sputtered from the liquid metallic target material to the surface of the substrate to be coated and in case of a compound film, at least one second component of the compound is introduced as a reactive gas to form the compound in the gas phase or/and on the surface of the substrate and/or the surface of the film.

19. The method according to claim 17, wherein the passive surface region ($S_P$) is in a peripheral or/and in a central area of the liquid target surface.

20. The method according to claim 17, wherein at least a part of the passive surface region ($S_P$) is projected by a darkroom shield, electrically isolated from the liquid metallic target material to shield the region ($S_P$) against sputtering or other glow discharge phenomena.

21. The method according to claim 20, wherein the darkroom shield forms a counter electrode of the liquid metallic target material.

22. The method according to claim 17, wherein the planar magnetron system comprises a magnetron magnet system and a DC-power supply or a pulsed DC-power supply.

23. The method according to claim 17, wherein the agitation of the liquid metallic target material comprises mechanical stirring, stirring induced by a current flow, applying ultrasonic waves to the liquid metallic target material, or a combination of stirring and applying ultrasonic waves.

24. The method according to claim 23, wherein the inner and the outer agitation-electrode are both connected to the DC-current source, whereby a DC-current is applied between the agitation-electrodes to generate a circulating movement of the liquid metallic target material at least between the agitation-electrodes.

25. The method according to claim 17, wherein the liquid metallic target material is a liquid metal or an alloy of at least two metals having a melting point $TM \leq 300°$ C. or $TM \leq 70°$ C. or $TM \leq 40°$ C.

26. The method according to claim 17, wherein a further target from a different material is used to deposit a compound at the substrate surface.

27. The method according to claim 17, wherein a dependency of one of the electric values sputter voltage, sputter current, or sputter power from the liquid level of the liquid metallic target material is used to produce a liquid level signal SLL by measuring the value V1 or a transformed value signal S1, and comparing it with a benchmark value V2 or a respectively transformed value signal S2 corresponding to a defined liquid level.

28. The method according to claim 27, wherein the liquid level signal is used to drive a liquid level indication device and/or to control a target liquid refill device of the system.

29. A method of manufacturing a semiconductor device according to claim 17, wherein the film is deposited on a semiconductive substrate.

* * * * *

UNITED STATES PATENT AND TRADEMARK OFFICE
CERTIFICATE OF CORRECTION

PATENT NO. : 11,952,654 B2
APPLICATION NO. : 17/287702
DATED : April 9, 2024
INVENTOR(S) : Dominik Jaeger et al.

Page 1 of 1

It is certified that error appears in the above-identified patent and that said Letters Patent is hereby corrected as shown below:

In the Specification

Column 14, Line 15:
"Total pressure: 0.29 Pa" should be --Total pressure: 0.37 Pa--.

Signed and Sealed this
Third Day of June, 2025

Coke Morgan Stewart
*Acting Director of the United States Patent and Trademark Office*